US010164176B2

United States Patent
Nagel et al.

(10) Patent No.: US 10,164,176 B2
(45) Date of Patent: *Dec. 25, 2018

(54) METHOD OF INTEGRATION OF A MAGNETORESISTIVE STRUCTURE

(71) Applicant: Everspin Technologies, Inc., Chandler, AZ (US)

(72) Inventors: Kerry Joseph Nagel, Scottsdale, AZ (US); Kenneth Smith, Chandler, AZ (US); Moazzem Hossain, Laveen, AZ (US); Sanjeev Aggarwal, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/399,971

(22) Filed: Jan. 6, 2017

(65) Prior Publication Data

US 2017/0117462 A1    Apr. 27, 2017

Related U.S. Application Data

(63) Continuation of application No. 14/704,915, filed on May 5, 2015, now Pat. No. 9,553,260, which is a
(Continued)

(51) Int. Cl.
*H01L 43/02*     (2006.01)
*H01L 43/08*     (2006.01)
(Continued)

(52) U.S. Cl.
CPC ........ *H01L 43/12* (2013.01); *H01L 21/28568* (2013.01); *H01L 21/32133* (2013.01);
(Continued)

(58) Field of Classification Search
CPC ..... H01L 27/22; H01L 27/222; H01L 27/224; H01L 27/226; H01L 27/228; H01L 43/08; H01L 43/12; G11C 11/16
See application file for complete search history.

(56) References Cited

U.S. PATENT DOCUMENTS 6,165,803 A * 12/2000 Chen ...................... B82Y 10/00
                                                    257/E21.665
6,365,419 B1     4/2002 Durlam et al.
(Continued)

OTHER PUBLICATIONS

International Preliminary Report Patentability in PCT/US2011/065573, dated Jun. 27, 2013.
(Continued)

*Primary Examiner* — Eric Ward
(74) *Attorney, Agent, or Firm* — Bookoff McAndrews, PLLC

(57) ABSTRACT

A method of manufacturing one or more interconnects to a magnetoresistive structure, the method comprising depositing a first conductive material (i) in a via which is formed through a first surface of a first dielectric layer and (ii) directly on the first surface of the first dielectric layer. The method further includes etching the first conductive material wherein, after etching the first conductive material, a portion of the first conductive material remains (i) in the via and (ii) directly on the first surface of the first dielectric layer. The method also includes partially filling the via by depositing a second conductive material (i) in the via and (ii) directly on the first conductive material remaining in the via, depositing a first electrode material (i) in the via and (ii) directly on the second conductive material which is in the via, and forming a magnetoresistive structure over the first electrode material.

13 Claims, 6 Drawing Sheets

Related U.S. Application Data continuation of application No. 13/328,874, filed on Dec. 16, 2011, now Pat. No. 9,054,297.

(60) Provisional application No. 61/424,359, filed on Dec. 17, 2010.

(51) Int. Cl.

| | |
|---|---|
| *H01L 43/12* | (2006.01) |
| *H01L 27/22* | (2006.01) |
| *H01L 21/285* | (2006.01) |
| *H01L 21/3213* | (2006.01) |
| *H01L 21/768* | (2006.01) |

(52) U.S. Cl.
CPC .... *H01L 21/7684* (2013.01); *H01L 21/76877* (2013.01); *H01L 27/222* (2013.01); *H01L 27/226* (2013.01); *H01L 43/02* (2013.01); *H01L 43/08* (2013.01); *H01L 21/76819* (2013.01); *H01L 27/228* (2013.01)

(56) References Cited

U.S. PATENT DOCUMENTS

| | | | |
|---|---|---|---|
| 6,911,156 B2 | 6/2005 | Grynkewich et al. | |
| 6,929,957 B2 | 8/2005 | Min et al. | |
| 7,144,744 B2 | 12/2006 | Lien et al. | |
| 7,223,612 B2 | 5/2007 | Sarma | |
| 7,399,646 B2 | 7/2008 | Kanakasabapathy et al. | |
| 7,514,272 B2 | 4/2009 | Fukada et al. | |
| 7,582,941 B2 | 9/2009 | Cho et al. | |
| 7,605,420 B2 | 10/2009 | Furuta et al. | |
| 7,706,175 B2 | 4/2010 | Hosotani et al. | |
| 7,880,249 B2 | 2/2011 | Yuan et al. | |
| 9,054,297 B2 | 6/2015 | Nagel et al. | |
| 9,553,260 B2 | 1/2017 | Nagel et al. | |
| 2005/0270828 A1 | 12/2005 | Motoyoshi | |
| 2006/0043452 A1 | 3/2006 | Ueda et al. | |
| 2006/0216935 A1 | 9/2006 | Oswald et al. | |
| 2008/0185670 A1 | 8/2008 | Kajiyama | |
| 2009/0209050 A1 | 8/2009 | Wang et al. | |
| 2010/0109106 A1 | 5/2010 | Zhong et al. | |
| 2010/0240212 A1* | 9/2010 | Takahashi | H01L 21/28556 438/637 |
| 2010/0264501 A1* | 10/2010 | Furuta | B82Y 10/00 257/421 |
| 2011/0260271 A1 | 10/2011 | Fukui | |
| 2012/0009785 A1* | 1/2012 | Chandrashekar | C23C 16/045 438/669 |

OTHER PUBLICATIONS

Search Report and Written Opinion dated Mar. 15, 2013 in PCT/US2011/065573.

Office Action in Chinese Application, dated Aug. 3, 2015, 16 pages.

Supplementary European Search Report, dated Jul. 13, 2015, 5 pages.

Extended Search Report, European Application No. 16196220.4, dated Mar. 20, 2017, 5 pages.

\* cited by examiner

METHOD OF INTEGRATION OF A MAGNETORESISTIVE STRUCTURE

RELATED APPLICATIONS

This application is a continuation of U.S. patent application Ser. No. 14/704,915, filed May 5, 2015 (now U.S. Pat. No. 9,553,260), which is a continuation of U.S. patent application Ser. No. 13/328,874, filed Dec. 16, 2011 (U.S. Pat. No. 9,054,297). This non-provisional application, the '915 application, and the '874 application claim priority to and the benefit of U.S. Provisional Application No. 61/424,359, filed Dec. 17, 2010.

TECHNICAL FIELD

The exemplary embodiments described herein generally relate to magnetoelectronics information devices and more particularly to magnetic random access memories.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field-switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The spin angular momentum carried by the spin-polarized tunneling current causes reversal of the free layer, with the final state (parallel or antiparallel) determined by the polarity of the current pulse. The memory elements are programmed by the magnetic field created from current-carrying conductors. Typically, two current-carrying conductors, the "digit line" and the "bit line", are arranged in cross point matrix to provide magnetic fields for programming of the memory element. Because the digit line usually is formed underlying the memory element so that the memory element may be magnetically coupled to the digit line, the interconnect stack that couples the memory element to the transistor typically is formed, using standard CMOS processing, offset from the memory element.

The interconnect stack is formed utilizing a number of vias and metallization layers. The via that electrically couples the interconnect stack to the memory element often is referred to as the MVia. Present day methods for forming MVias in an MRAM device often produce undesirable results and challenges. For example, the MVia is positioned adjacent to the interconnect stack and connected thereto by a digit line landing pad, which typically is formed at the same time the digit line is formed.

Efforts have been ongoing to improve scaling, or density, of MTJ elements in an MRAM array. However, such efforts have included methods that use multiple masking and etching steps that consume valuable real estate in the MRAM device. Because an MRAM device may include millions of MTJ elements, such use of real estate in the formation of each MTJ element can result in a significant decrease in the density of the MRAM device.

Accordingly, it is desirable to provide a process for manufacturing a magnetic random access memory that provides improved scaling. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

Methods and structures are described for manufacturing a magnetoresistive memory element having a conductive via, for connecting between a digit line and one side of the magnetoresistive memory element, positioned beneath, and aligned with, each magnetoresistive memory element. Other contacts on an array of the magnetoresistive memory elements may satisfy the same design rules, using the same process step.

In accordance with a first exemplary embodiment, a method of manufacturing a magnetic element, the method comprises forming a first via in a first dielectric material; forming a first conductive material in the first via, wherein the first conductive material creates a step function with the first dielectric layer, the step function having a magnitude; reducing the magnitude of the step function; and forming a magnetic tunnel junction over, and aligned with, the first via.

A second exemplary embodiment includes a method of manufacturing a magnetic element, the magnetic element comprising etching a via through a first dielectric layer; forming a first conductive material in the first via; forming a first electrode on, and having a first surface opposed to, the first conductive material and the first dielectric layer; polishing the first surface; and forming a magnetic tunnel junction on the first surface, the magnetic tunnel junction aligned with, and in electrical contact with, the first conductive material.

A third exemplary embodiment includes a method of manufacturing a magnetic element, comprising etching a first via through a first dielectric layer; forming a first conductive material in the first via; etching a portion of the first conductive material; forming a second conductive material over the first conductive material remaining in the first via; forming a first electrode over the second conductive material; and forming a magnetic tunnel junction over the first electrode.

BRIEF DESCRIPTION OF THE DRAWINGS

The present invention will hereinafter be described in conjunction with the following drawing figures, wherein like numerals denote like elements.

DETAILED DESCRIPTION

Figure 1:
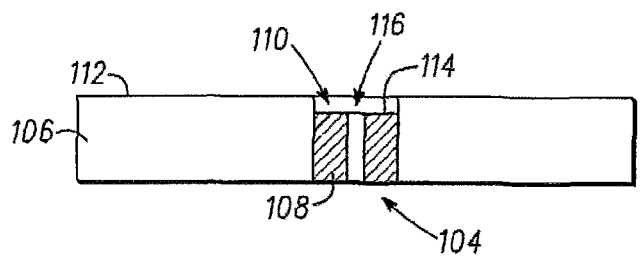
FIGS. 1-4 are cross sections of a magnetoresistive memory element manufactured in accordance with a first exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

In general, methods and structures are described for manufacturing a magnetoresistive memory element, e.g., a magnetic tunnel junction (MTJ) device. A conductive via for connecting between a digit line and one side of the magnetic device is positioned beneath, and aligned with, each magnetic device. Other contacts may satisfy the same design rules, using the same process step. This integration approach allows for improved scaling the MRAM devices to at least a 45 nanometer node and a cell packing factor approaching 6 $F^2$. Without implementing the on-axis via, the cell packing factor must be greater than 20 $F^2$.

During the course of this description, like numbers are used to identify like elements according to the different figures that illustrate the various exemplary embodiments.

For simplicity and clarity of illustration, the drawing figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During fabrication of an MRAM array architecture, each succeeding layer is deposited or otherwise formed in sequence and each MTJ device may be defined by selective deposition, photolithography processing, etching, etc. using any of the techniques known in the semiconductor industry. Typically the layers of the MTJ are formed by thin-film deposition techniques such as physical vapor deposition, including magnetron sputtering and ion beam deposition, or thermal evaporation.

Magnetoresistance is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

FIGS. 1-4 illustrate a process for manufacturing a magnetoresistive memory device 100, including a magnetic bit 102 (magnetic tunnel junction). In practice, an MRAM architecture or array will include many MRAM devices 100, typically organized in a matrix of columns and rows. In forming each magnetoresistive memory device, a via 104 is etched in a dielectric layer 106 and a conductive material 108 is deposited within the via 104. Dielectric material 106, as well as any other dielectric material mentioned hereafter, may be formed of any suitable dielectric material, for example, silicon dioxide. The conductive material 108 may be fabricated using well known CMOS processes, such as damascene processing or subtractive pattern processing such as etching, and preferably comprise tantalum (Ta), tungsten (W), or ruthenium (Ru), but may comprise any suitable conductive material, such as aluminum (Al), aluminum alloys, copper (Cu) and copper alloys and may include barrier materials such as, for example, tantalum (Ta), tantalum nitride (TaN), titanium (Ti), titanium nitride (TiN), or titanium tungsten (TiW). The conductive material 108 may be electrically coupled to a transistor formed in a semiconductor substrate as described in more detail in subsequent embodiments.

However, the deposition of the conductive material 108 in the via 104 may create a "step function" 110, which is a difference in the level (dimension having a magnitude) of the surface 112 of the dielectric material 106 and the surface 114 of the conductive material 108. The surface 114 of the conductive material 108 may be above or below the surface 112 of the dielectric material 106. Additionally, the deposition of the conductive material may create a "seam" 116, or opening, vertically within the conductive material 108. Both the step function and seam create uneven surfaces that are propagated upward during the subsequent forming of additional layers above the via 104.

Figure 2:
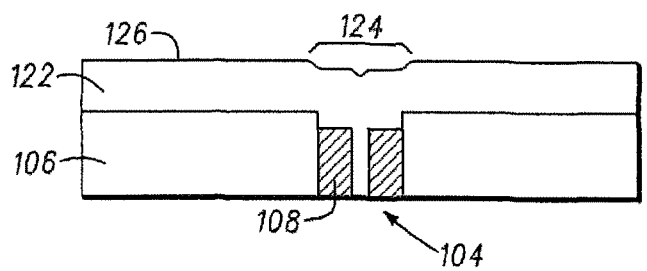
Figure 3:
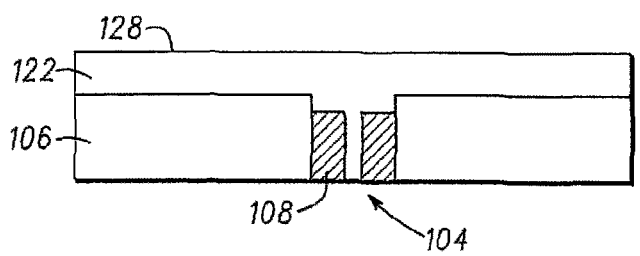

In accordance with the exemplary embodiment, an electrode 122 is deposited on the dielectric layer 106 and the via including the conductive material 108, generally filling in the step function 110 and the seam 116 (FIG. 2). Note that the "defects" 124 are propagated to the top surface 126 of the electrode 122. In order to eliminate this upward propagation of these defects, a polish, or smoothing, of the top surface 124 is performed resulting in a smooth surface 128 (FIG. 3).

Figure 4:
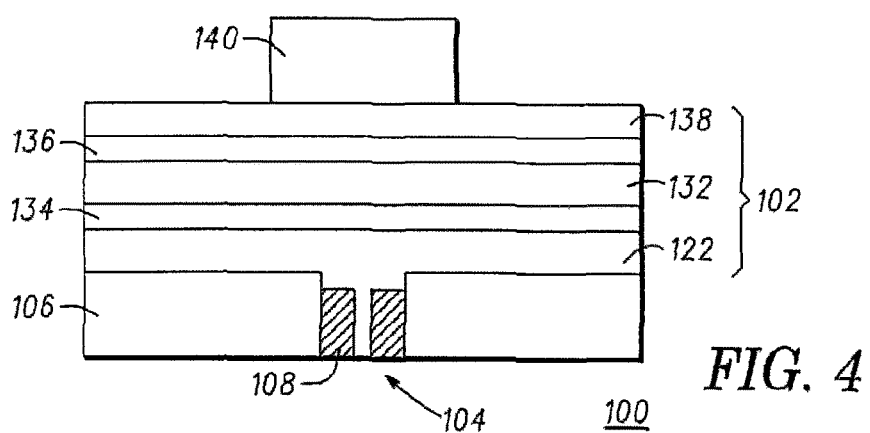

Referring to FIG. 4, the magnetic bit 102 is formed over the conductive material 108 in the via 104. The magnetic bit 102 includes a tunnel barrier 132 formed between a fixed layer 134 and a free layer 136. The tunnel barrier 132 may be a dielectric, typically an oxide such as MgO or AlOx. The position of the fixed layer 134 and the free layer 136 may be reversed. Another electrode 138 is deposited on the free layer 136. A metal contact layer 140 is optionally deposited on the electrode 138 for contact to a metal layer (not shown). While a three layer magnetic bit 102 is shown, various other types of magnetic bits, including for example spin torque, dual tunnel barrier, dual spin filter, and field switching devices may be used with the present invention.

The first and second electrodes 122, 138 are formed from any suitable material capable of conducting electricity. For example, electrodes 122, 138 may be formed from at least one of the elements Al, Cu, Ta, TaNx, Ti or their combinations. The various ferromagnetic layers 134, 136 including those in electrodes 122, 138 as known to those skilled in the art may comprise any suitable material having the desired ferromagnetic properties as described above.

In practice, MRAM device 100 may employ alternative and/or additional elements, and one or more of the elements depicted in FIG. 4 may be realized as a composite structure or combination of sub-elements. The specific arrangement of layers shown in FIG. 4 merely represents one suitable embodiment of the invention.

The via 104 is placed below the magnetic bit 102 for coupling the bottom electrode 122 directly or indirectly to a transistor source or drain (not shown). The via 104 is below and aligned with the magnetic bit 102, thereby eliminating additional conducting lines if the via were placed beside the magnetic bit; thereby improving scaling and cell packing (density).

For the purposes of clarity, some commonly-used layers have not been illustrated in the drawings, including various protective cap layers, seed layers, and the underlying substrate (which may be a conventional semiconductor substrate or any other suitable structure). For the exemplary embodiments shown, the bottom electrode 122 is a ferromagnetic polarizer, while the top electrode 138 may be either a non-ferromagnetic material or a ferromagnetic polarizer. Alternatively, only the top electrode 138 may be a ferromagnetic polarizer. Generally, a ferromagnetic polarizer would include a pinning layer, a pinned magnetic layer, a coupling spacer layer, and a fixed magnetic layer adjacent to the tunnel barrier 132 (none of which are shown in FIG. 4) as is well known in the industry.

Figure 5:
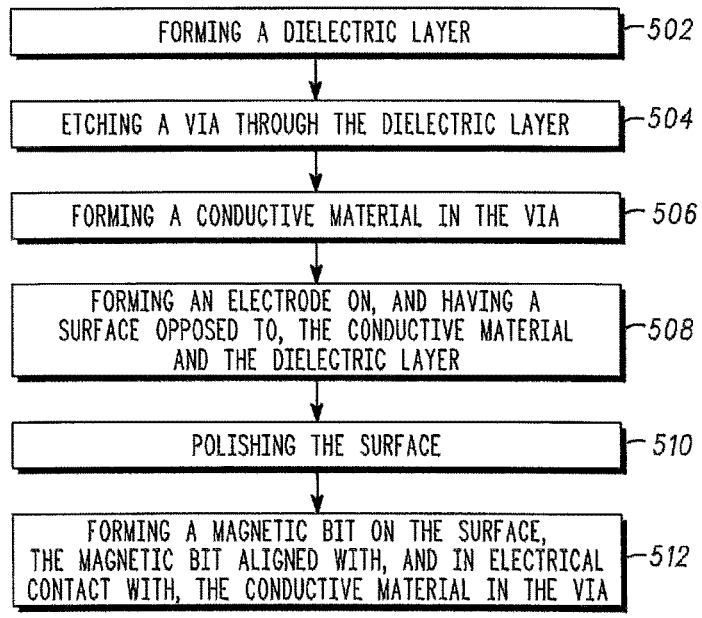
FIG. 5 is a flow chart in accordance with an exemplary process for manufacturing the magnetoresistive memory element of FIGS. 1-4.

Referring to FIG. 5, the steps of forming the magnetic bit 102 over the via 104 include forming 502 the dielectric layer 106 and etching 504 a via 104 through the dielectric layer 106. A conductive material 108 is formed 506 in the via 104, and an electrode 122 is formed 508 on, and having a surface 126 opposed to, the conductive material 108 and the dielectric layer 106. A polishing 510 of the surface 126 is performed and a magnetic bit 102 is formed 512 on the surface. Therefore, the magnetic bit 102 is aligned with, and in electrical contact with, the conductive material 108 within the via 104.

Figure 6:
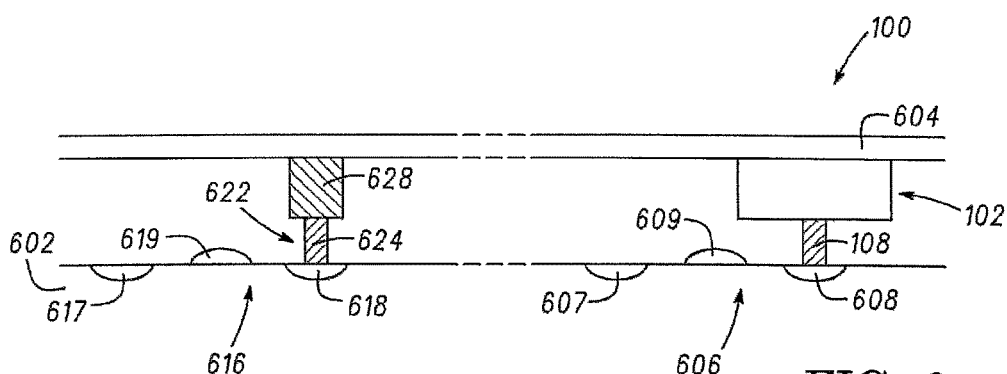
FIG. 6 is a cross section of an array of magnetoresistive memory elements including a contact via in accordance with a second exemplary embodiment.

Referring to FIG. 6, an array of the magnetoresistive devices 100 are formed between a dielectric layer 602 and a metal line 604. Though only one magnetoresistive device 100 is shown, the number of magnetoresistive devices 100 could be up to the gigabit range. The conductive material 108 within the via 104 is formed over a transistor 606 including conducting electrodes 607, 608 and a gate 609. More specifically, the conductive material 108 is in contact with the conducting electrode 608. Another transistor 616, including conducting electrodes 617, 618 and gate 619 is formed in the dielectric layer 602. In order to provide a connection from the transistor 616 (specifically the conducting electrode 618 as shown) to the metal line 604, a contact 622 is formed (during the same process step with via 104 (FIG. 1)) in the dielectric layer 106 and a conductive material 624 is deposited therein. A conductive via 628 is then formed above the contact 622 for coupling to the metal line 604. This architecture allows positioning the magnetic bit below the first metal layer. With this selection, it is possible to design the bitcell to avoid use of additional connections down to the underlying transistor in every bitcell, thereby enabling shrinkage of the bitcell to a cell factor of 6 $F^2$.

Figure 7:
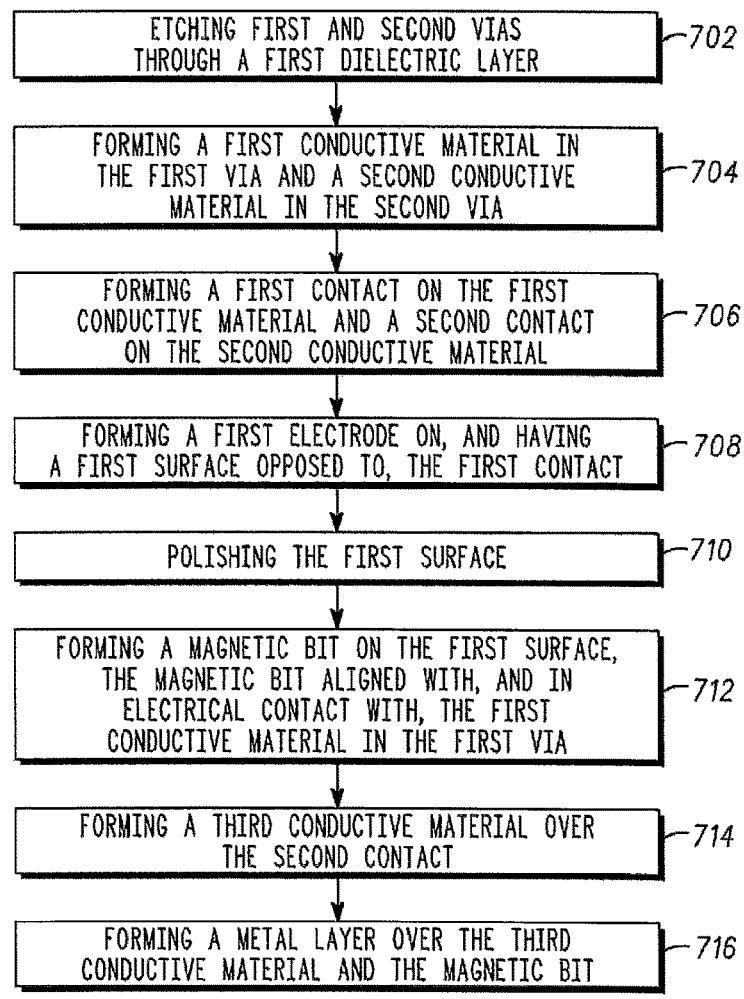
FIG. 7 is a flow chart in accordance with an exemplary process for manufacturing the magnetoresistive memory array of FIG. 6.

The process for forming this array of magnetoresistive memory devices includes the steps of (FIG. 7) etching 702 a plurality of vias 104, 622 through a first dielectric layer and forming 704 a conductive material 108, 624 in the vias 104, 622. For each of the magnetoresistive memory devices 100, a first contact is formed 706 on the first conductive material 108 in the first via and a second contact 622 on the second conductive material. A first electrode is formed 708 on, and having a surface opposed to, the conductive material 108. The surface is polished 710, and a magnetic bit is formed 712 on the surface, wherein the magnetic bit is aligned with, and in electrical contact with, the conductive material 108 in the via 104. At the time of forming the conductive material 108 for the magnetoresistive memory devices 100, the additional contact 624 is formed 706 in the dielectric material 106 but displaced from the magnetoresistive memory devices 100. A conductive via 628 is then formed 714 above the contact 622 for coupling to the metal line 604. Typically the metal layer 604 is formed over both the third conductive material 628 and the magnetic bit 102.

Figure 8:
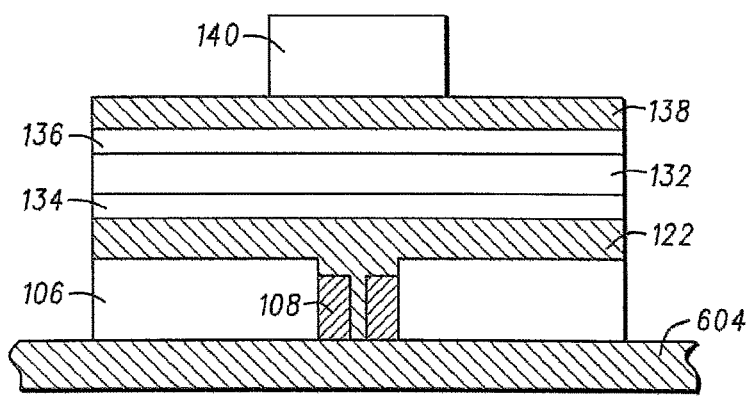
FIG. 8 is a cross section of a magnetoresistive memory element manufactured in accordance with a third exemplary embodiment.

Alternatively, referring to FIG. 8, the magnetoresistive memory element 100 of FIG. 4 may be formed above the metal line 604 (FIG. 6), which may be any metal layer.

Figure 9:
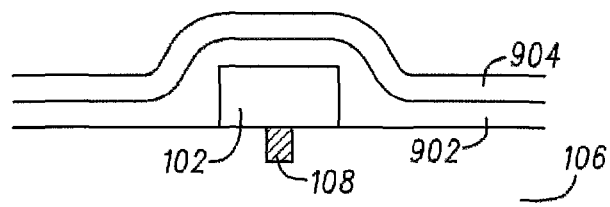
FIGS. 9-12 are cross sections of a magnetoresistive memory element manufactured in accordance with a fourth exemplary embodiment.
Figure 10:
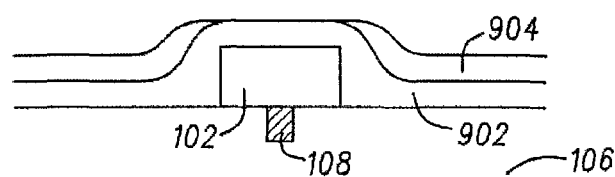
Figure 11:
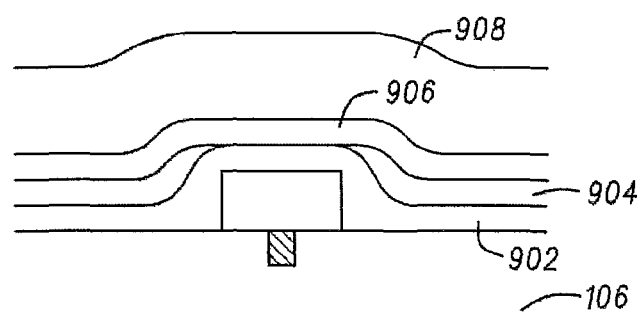
Figure 12:
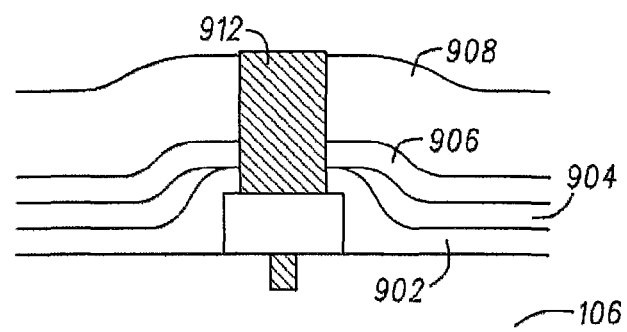

In addition to the process steps and advantages thereof mentioned above, a chemical mechanical polish (CMP) process may be performed to allow for a thinner upper electrode. Referring to FIG. 9, a polish stop layer 902 of a dielectric material is deposited over the magnetic bit 102 and the dielectric layer 106. A dielectric layer 904 is deposited over the polish stop layer 902. A polish, preferably a CMP, is performed to remove the dielectric layer above the magnetic bit 102 (FIG. 10). An etch stop layer 906 is deposited over the polish stop layer 902 and the dielectric layer 904, and a dielectric layer 908 is deposited over the etch stop layer 906 (FIG. 11). An etch is performed to remove the dielectric layer 908 above the magnetic bit and another etch is performed to remove the etch stop layer 904 and the polish stop layer 902 over the magnetic bit 102. A metal 912 is then formed within the opening above, and in contact with, the magnetic bit 102 (FIG. 12).

Figure 13:
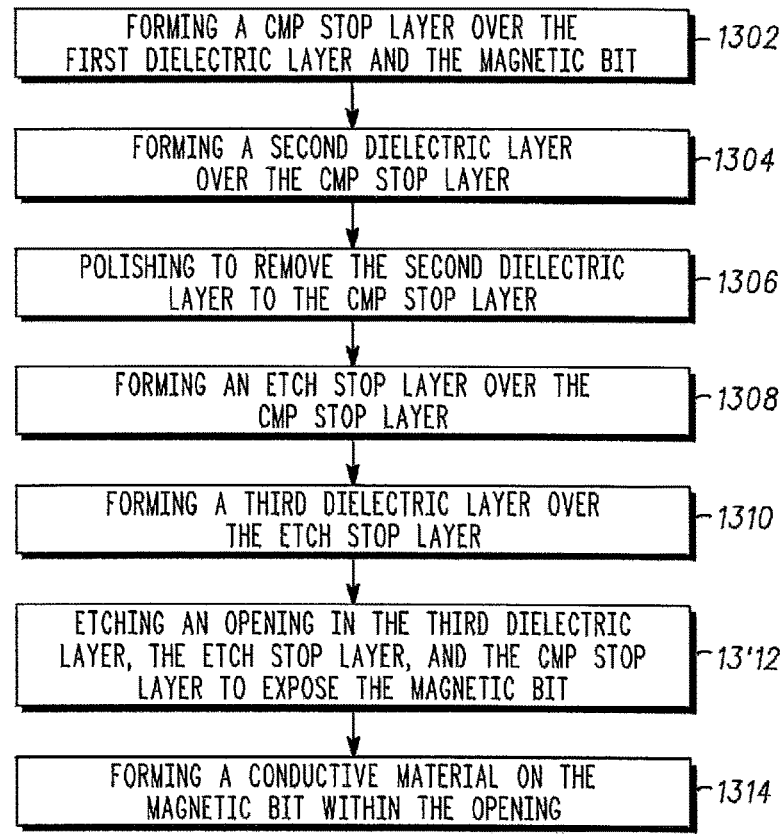
FIG. 13 is a flow chart in accordance with an exemplary process for manufacturing the magnetoresistive memory element of FIGS. 9-12.

FIG. 13 is a flow chart of the steps of the CMP process, including forming 1302 a CMP stop layer 902 over the first dielectric layer 106 and the magnetic bit 102. A second dielectric layer 904 is deposited 1304 over the CMP stop layer 902. A polish is performed 1306 to remove the second dielectric layer 904 to the CMP stop layer 902. An etch stop layer 906 is deposited 1308 on the CMP stop layer 902 and a third dielectric layer 908 is formed 1310 over the etch stop layer 906. An opening 912 is then etched 1312 through the third dielectric layer 908, the etch stop layer 906, and the CMP stop layer 902 to expose the magnetic bit 102. A conductive material 912 is formed 1314 on the magnetic bit 102 within the opening 912.

Figure 18:
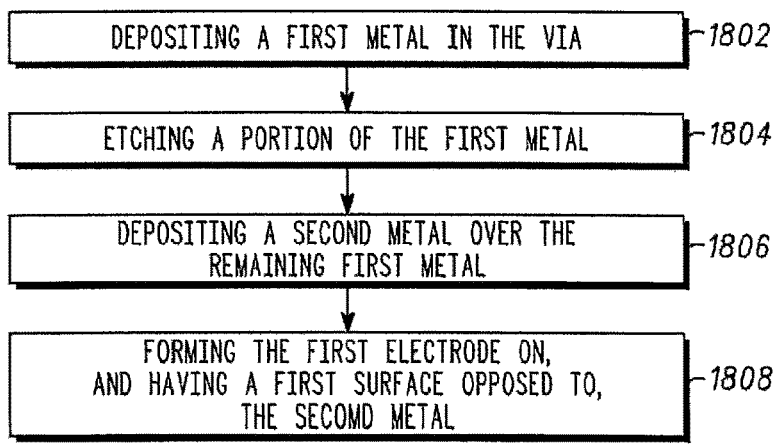
FIG. 18 is a flow chart in accordance with an exemplary process for filling the via of FIGS. 14-17.
Figure 14:
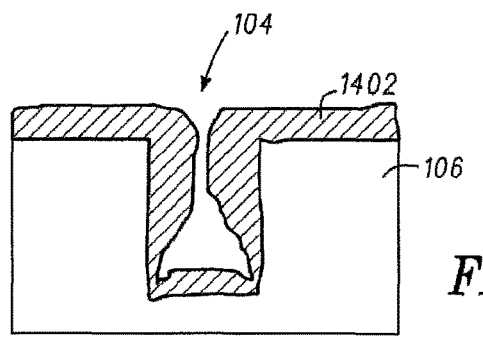
FIGS. 14-17 are cross sections of an exemplary process for filling a via in the magnetoresistive memory elements of FIGS. 1-4, 6, 8, and 9-12.
Figure 15:
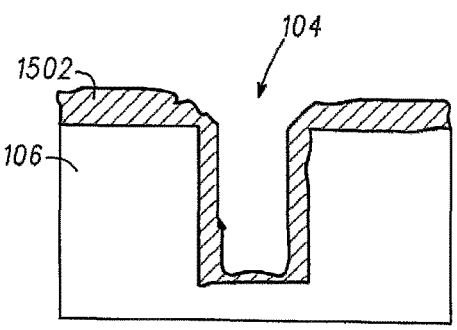
Figure 16:
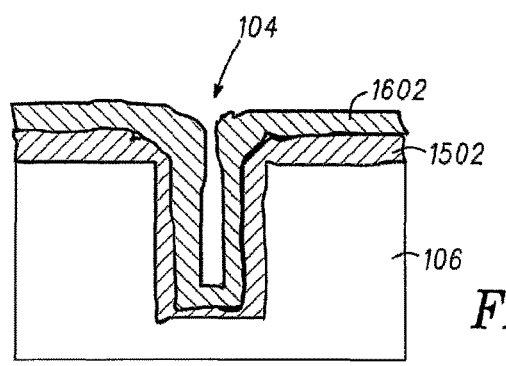
Figure 17:
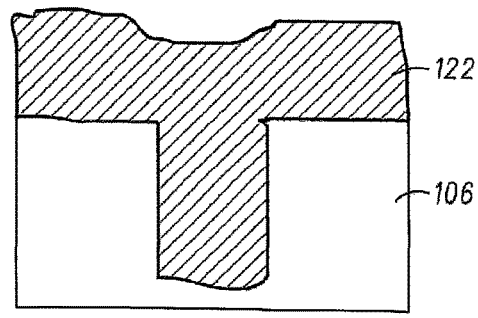

Yet additional improvements may be made to the process for manufacturing the magnetoresistive memory device 100 by filling the via 104 by a deposition-etch-deposition process, that may be performed in-situ (within the same chamber or on the same platform without breaking vacuum). FIGS. 14-17 are cross sectional drawings illustrating the process, which is shown in the flow chart of FIG. 18. A first metal 1402 is deposited 1802 in the via 104. An etch is performed 1804 to remove a first portion of the first metal 1402 while leaving a second portion 1502 within the via 104. A second metal 1602 is formed 1806 over the second portion 1502, including within the via 104 (FIG. 16). The electrode 122 (see FIG. 2-4) is deposited 1608 over the second metal 1602, resulting in a smoother "filling" of the via 104. A polishing of the electrode may then be performed as discussed above. Optionally, more of the material of the electrode 122 may be deposited over the electrode 122 subsequent to the polishing.

Although the described exemplary embodiments disclosed herein are directed to various semiconductor memories and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the free and pinning layers in a memory structure may be reversed so that the pinning layer is on top and the free layer is below. Also the free layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

A number of embodiment have been presented in the foregoing detailed description. It should be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of manufacturing one or more interconnects to a magnetoresistive structure, the method comprising:
   depositing a first conductive material (i) in a via which is formed through a first surface of a first dielectric layer and (ii) directly on the first surface of the first dielectric layer;
   etching the first conductive material wherein, after etching the first conductive material, a portion of the first conductive material remains (i) in the via and (ii) directly on a portion of the first surface of the first dielectric layer;
   partially filling the via by depositing a second conductive material (i) in the via and (ii) directly on the first conductive material remaining in the via;
   depositing a first electrode material (i) in the via and (ii) directly on the second conductive material which is in the via; and
   forming a magnetoresistive structure over the first electrode material.

2. The method of claim 1 wherein depositing the first conductive material, etching a portion of the first conductive material, and depositing the second conductive material are performed in-situ.

3. The method of claim 1 wherein:
   the first conductive material comprises tantalum or tantalum-nitride, and
   the first electrode material comprises tantalum or tantalum-nitride.

4. The method of claim 1 wherein the magnetoresistive structure is a magnetic bit.

5. The method of claim 4 wherein depositing the first conductive material, etching the first conductive material, and depositing the second conductive material are performed in-situ.

6. The method of claim 1 wherein the method further includes depositing a second electrode material directly on the first electrode material, and wherein forming a magnetoresistive structure over the first electrode material includes forming a magnetoresistive structure directly on the second electrode material.

7. The method of claim 1 wherein depositing the second conductive material further includes depositing the second conductive material directly on the first conductive material that is located directly on the portion of the first surface of the first dielectric layer.

8. The method of claim 1 wherein the method further includes polishing a first surface of the first electrode material.

9. The method of claim 8 wherein, after polishing the first surface of the first electrode material, the method further includes depositing a second electrode material directly on the first electrode material, and wherein forming a magnetoresistive structure over the first electrode material includes forming a magnetoresistive structure directly on the second electrode material.

10. The method of claim 9 wherein forming a magnetoresistive structure over the first electrode material includes forming a magnetoresistive structure directly on the second electrode material.

11. The method of claim 1 wherein depositing the first conductive material, etching a portion of the first conductive material, and depositing the second conductive material are performed in-situ, and wherein the method further includes:
    polishing a first surface of the first electrode material.

12. The method of claim 11 wherein, after polishing the first surface of first electrode material, the method further includes depositing a second electrode material directly on the first electrode material, and wherein forming a magnetoresistive structure over the first electrode material includes forming a magnetoresistive structure directly on the second electrode material.

13. The method of claim 1 wherein the method further includes depositing a second electrode material directly on the first electrode material.

\* \* \* \* \*